(12) United States Patent
Schmaelzle et al.

(10) Patent No.: US 8,792,174 B2
(45) Date of Patent: Jul. 29, 2014

(54) ARRAY OF MICROLENSES WITH INTEGRATED ILLUMINATION

(75) Inventors: Philipp Schmaelzle, Los Altos, CA (US); Jacques Duparre, Jena (DE); Martin Punke, Mittelbiberach (DE); Peter Dannberg, Jena (DE); Reinhard Voelkel, Neuchatel (CH); Andreas Braeuer, Schloeben (DE)

(73) Assignee: Fraunhofer-Gesellschaft zur Foerderung der Angewandten Forschung, Munich (DE)

( * ) Notice: Subject to any disclaimer, the term of this patent is extended or adjusted under 35 U.S.C. 154(b) by 1104 days.

(21) Appl. No.: 12/734,212

(22) PCT Filed: Oct. 15, 2008

(86) PCT No.: PCT/EP2008/008734
§ 371 (c)(1),
(2), (4) Date: Oct. 8, 2010

(87) PCT Pub. No.: WO2009/052980
PCT Pub. Date: Apr. 30, 2009

(65) Prior Publication Data
US 2011/0025899 A1    Feb. 3, 2011

(30) Foreign Application Priority Data
Oct. 19, 2007   (DE) .......................... 10 2007 050 167

(51) Int. Cl.
*G02B 27/10* (2006.01)
*H01L 27/146* (2006.01)
*G02B 3/00* (2006.01)
*G02B 21/00* (2006.01)

(52) U.S. Cl.
CPC ........ *G02B 3/0012* (2013.01); *H01L 27/14623* (2013.01); *G02B 3/0075* (2013.01); *H01L 27/14627* (2013.01); *G02B 3/0056* (2013.01); *G02B 21/0004* (2013.01); *H01L 27/14685* (2013.01)
USPC ......................................... 359/622; 359/619

(58) Field of Classification Search
USPC ......... 359/619–623, 626, 486.1, 576; 355/67; 348/308, 360, 370; 353/20, 121; 362/616; 445/46, 58
See application file for complete search history.

(56) References Cited

U.S. PATENT DOCUMENTS 5,052,783 A * 10/1991 Hamada ........................... 349/5
5,444,520 A *  8/1995 Murano ......................... 399/221
5,617,131 A *  4/1997 Murano et al. ................ 347/233

(Continued)

FOREIGN PATENT DOCUMENTS

DE          4342265 A1    6/1994
DE         19755565 A1    6/1998

(Continued)

*Primary Examiner* — Loha Ben
(74) *Attorney, Agent, or Firm* — Jacobson Holman, PLLC.

(57) ABSTRACT

The invention relates to a microlens array with integrated illumination, an imaging system with such a microlens array, an image detection device and also a method for producing the microlens array.

55 Claims, 4 Drawing Sheets

(56) References Cited

U.S. PATENT DOCUMENTS

| | | |
|---|---|---|
| 5,808,986 A | 9/1998 | Jewell et al. |
| 6,646,807 B2 * | 11/2003 | Yoshikawa et al. ............ 359/619 |
| 6,788,467 B2 * | 9/2004 | Miyamae et al. ............. 359/619 |
| 6,987,259 B2 | 1/2006 | Olszak et al. |
| 7,025,511 B2 * | 4/2006 | Nakajima ........................ 385/93 |
| 7,428,027 B2 * | 9/2008 | Takayama ....................... 349/95 |
| 7,746,559 B2 * | 6/2010 | Sharon et al. .................. 359/618 |
| 2001/0026322 A1 | 10/2001 | Takahashi et al. |
| 2005/0243161 A1 | 11/2005 | Wong et al. |
| 2006/0291185 A1 | 12/2006 | Atshushi |

FOREIGN PATENT DOCUMENTS

| | | |
|---|---|---|
| EP | 0840502 A1 | 5/1998 |
| JP | 2001237404 | 8/2001 |
| WO | WO 2005/004245 A2 | 1/2005 |
| WO | WO 2005/069607 A1 | 7/2005 |
| WO | WO 2007/082781 A1 | 7/2007 |

* cited by examiner

| Surface # | Surface type | Aperture | Comment | Radius of curvature [mm] | Thickness [mm] | Glass [n/V] | Radius [mm] |
|---|---|---|---|---|---|---|---|
| OBJ | Standard | | | ∞ | 0 | Air | 0.353 |
| 1 | CBR | | Coordinate makeup | - | 0 | Air | - |
| 2 | Standard | | | ∞ | 1.962 | Air | 0.353 |
| 3 | Standard | | MLA1 (Substrate) | ∞ | 0.400 | 1.52/55 | 0.154 |
| STO | Standard | UDA | MLA1 (Aperture) | ∞ | 0.100 | 1.52/60 | 0.127 (U) |
| 5 | US array | | MLA1 (Focus lens) | -0.3524 | 0.535 | Air | 0.136 |
| 6 | Standard | | MLA2 (Substrate) | ∞ | 0.400 | 1.52/55 | 0.136 |
| 7 | Standard | UDA | MLA2 (Field aperture) | ∞ | 0.353 | 1.52/60 | 0.142 |
| 8 | US array | | MLA2 (Field lens) | -0.2734 | 0.600 | Air | 0.197 |
| 9 | US array | | MLA3 (Transmission lens) | +0.2646 | 0.100 | 1.52/60 | 0.112 |
| 10 | Standard | UDA | MLA3 (Aperture) | ∞ | 0.400 | 1.52/55 | 0.100 |
| 11 | Standard | | MLA3 (Substrate) | ∞ | 1.151 | Air | 0.130 |
| 12 | CBR | | Coordinate makeup | - | 0 | Air | - |
| IMA | Standard | | | ∞ | - | - | 0.426 |

ARRAY OF MICROLENSES WITH INTEGRATED ILLUMINATION

The invention relates to a microlens array with integrated illumination, an imaging system with such a microlens array, an image detection device and also a method for producing the microlens array.

It is desirable for many applications to image a very close, approximately flat object with a compact, in particular axially compact (i.e. short), imaging system onto an image sensor. In order to achieve a high information content, desirable properties of the optical imaging are low impairment by aberrations and diffraction effects, a large object field and not too small a transverse imaging scale (m≥1, i.e. 1:1 or enlarging) in order to make as good use as possible of the resolution limit of a given image sensor, set by pixilation, for object scanning.

In the case of "conventional lens systems" (in the following single-channel lens systems are hence always intended to be described), considerable constructional space perpendicular to the object plane (termed here z direction or axial direction) is required for this purpose. If an object field which is extended in the transverse direction is required, the constructional space in z direction must likewise be enlarged or a greater effect by image errors must be accepted. In both cases, the scaling of the object- and image field requires considerable additional complexity since the lens system design must be modified and, in general, other components must be used for the imaging lens system.

In the case of "parallel lens systems" which can be produced very advantageously in particular with microlens arrays, the constructional space required in z direction is independent of the size of the object field. A compact, in particular axially compact ("short"), constructional shape is hence possible. If special array-lens system criteria (which extend beyond the normal valuation criteria for optical imaging systems) are taken into account in the design of the parallel optical elements, an extension of the object field can be achieved merely by combining further elements. This favourable scaling behaviour can be achieved in particular with imaging systems with transverse enlargement m=1 (subsequently termed 1:1 imaging systems).

Lens systems with flat constructional shapes (short system length in z direction) are frequently preferred for practical reasons. For good imaging properties (e.g. with respect to light intensity, resolution capacity etc.) it is then necessary to provide equally short operating spacings between object and lens system, "short" intending to be interpreted with respect to the system length.

If a small spacing between an object to be imaged and the lens system is sought, then the illumination of the object assumes a special significance. For self-illuminating objects and for light-permeable objects, the illumination is extensively non-problematic. Normally, suitable background illumination is disposed on the side of the object orientated away from the lens system.

In the case of non-self-illuminating and non-transparent objects, the illumination can be effected however only by incident light. Precisely in the case of a large object surface area and a small spacing between object and lens system, such incident illumination is however problematic.

Included in standard methods of incident illumination is illumination from the side. Such illumination is however difficult to scale and leads to a non-homogeneous illumination intensity with reducing light intensity towards the middle of the object.

Another standard method resides in mirroring light via semi-transparent mirrors. If however the spacing between object and lens system is intended to be kept small, then such illumination is disadvantageous.

U.S. Pat. No. 6,987,259 describes the arrangement of illumination elements in the plane of the detector elements (i.e. in the direction of the image of the lens system).

Direct or reflected paths between illumination elements and detector elements are difficult to avoid in this application since the illumination beam path passes through all elements of the imaging lens system. If such paths are present, the image quality suffers significantly. Furthermore, the arrangement allows merely illumination with light projected into the object plane (critical illumination).

The invention is therefore intended to achieve the following objects. The imaging of an object extending in a plane is intended to be possible without the lens system requiring to be moved relative to the object, relative to the image sensor or relative to both. This means that scanning of the object is intended to be avoided. This construction is intended to be as flat as possible. Furthermore, the imaging system and the lens system are intended to be producible with as few components as possible in order to be economical. In particular, the number of components to be adjusted relative to each other is intended to be low and each of the components is intended to be constructed from as low as possible a number of layers which require to be produced separately. Nevertheless, as homogeneous an illumination as possible is intended to be made possible, which illumination is homogeneous irrespective of the scaling of the object and of the imaging lens system.

These objects are achieved by the microlens array, the imaging system, the method for producing the microlens array and also by the image detection device, each of which is described and claimed herein.

The invention firstly relates to a microlens array. This has an optically transparent basic body, on, at or in one side of which a large number of microlenses is disposed. These microlenses can be secured on the basic body, connected integrally with it or integrated in the basic body. In particular, the microlenses can also be disposed between the two surfaces of the basic body. In this case, the microlenses would be disposed behind the first side of the basic body.

According to the invention, the microlens array has in addition at least one light source which is disposed at, in or on the flat optically transparent basic body. The at least one light source is hereby disposed such that its projection is in the direction of the optical axes of the microlenses of the microlens array onto the first side of the basic body between the microlenses. The microlenses can be at a spacing from each other for this purpose. In particular a large number of light sources can be correspondingly disposed and shine through between the microlenses at various positions. The main light radiation direction of the light sources is thereby preferably essentially parallel to or closely around the optical axes of the microlenses and in the direction of the object to be imaged.

In order to preserve a part of the "base area" of the array for illumination elements, i.e. preferably between the free openings of the microlens or aperture arrays (subsequently termed in general imaging channels), surface areas are provided which are not intended for passage of imaging beam paths. As a result, a reduced filling factor is produced in general (taken as surface area quotient of the free openings to the array surface area).

Disruptive back reflections of the incident light (e.g. on substrate rear-sides) can hereby be suppressed by the free design according to the invention of the illuminating partial surfaces (e.g. by structuring methods). For this purpose, minimum spacings between imaging apertures and illumination elements are maintained, which are generally dependent upon the axial spacing between the illumination elements and relevant (partial-) reflecting surfaces.

The mode of operation of this technique for false light suppression is based on allowing back-reflection beams, which intersect the imaging apertures, only at greater angles of incidence (relative to the surface normal) than the maximum acceptance angle of the lens system at this location.

The light sources are preferably disposed on the same side of the optically transparent basic body or on that side of the basic body situated opposite the side carrying the microlenses.

For specific applications, the basic body and hence the microlens array can be curved. However, it is preferred that the transparent basic body extends in one plane. This plane is normally situated parallel to the lens planes of the microlenses.

The microlenses and/or the light sources preferably have respectively all essentially the same dimensions. In particular, the dimensions of the light sources can correspond with those of the microlenses.

For uniform and homogeneous imaging, it is preferred if the light sources and/or the microlenses are disposed in a grid. This grid can be rectangular with lines and columns perpendicular to each other or it can also be hexagonal. The light sources can be disposed in the same lines and/or columns as the microlenses, however they can also be disposed in lines and/or columns which are inserted respectively between the lines and/or columns of the microlenses.

In order to make possible flat constructional dimensions, the axial extension of the microlens array with the basic body is preferably very small relative to the lateral edge length of microlens array or basic body. There is hereby understood by the axial extension or constructional length the extension in a direction parallel to the optical axes of the microlenses or in a direction perpendicular to the plane of the microlens array or of the basic body. There is understood by the lateral extension that extension in a direction parallel to the lens plane of the microlenses or the plane of the microlens array or of the basic body. A small axial constructional length therefore means that the microlens array is very flat. The entire optical arrangement, i.e. the complete imaging system, in particular with possibly present detector elements, is also preferably very flat in the above sense.

It is particularly preferred if one, several or all of the light sources have light emitters between two electrodes, have an organic light diode and/or an organic luminescent diode. The light sources can have or comprise in particular polymers and/or small molecules as organic light- or luminescent diodes. These can be produced on a wafer scale. Also EL foils, quantum dot LEDs and light guides (such as display backlights) are possible.

In order to make possible the measurement of the spectral reflection properties of an object surface, at least two light sources of the microlens array have different emission spectra.

In particular, at least a part of the light sources can emit a part or their entire radiation in a spectral range outwith visible light. This allows determination of spectral reflection properties of an object surface in a non-visual spectral range. Also light excitation (fluorescence) with blue UV OLEDs is possible.

In general, direct radiation of the illumination elements is desired only in the direction of the object, whilst direct radiation in the direction of the image sensor must be suppressed as false light.

In imaging systems with integrated illumination, it is therefore important to minimise the proportion of the produced light flow which reaches the image sensor without the intended scattering at the object. Otherwise, a contrast-reducing false light influence has a disadvantageous effect. It is advantageous for this purpose to isolate the illumination elements optically from the imaging channels by light-impermeable materials. This can be achieved by suitable structuring of the illumination elements which then emit only within specific partial surface areas.

It is preferred for economic and simple production if the at least one light source has a flat configuration and has a light-emitting effect only in zones disposed in a grid-like manner. Such zones can be produced for example by grid-like apertures or by removing parts of the light source layer or at least one of the two electrodes.

In order to achieve that the radiation of the light source is concentrated about a direction parallel to the optical axis of the microlenses in the direction of the object, the light source can be surrounded by an aperture layer which extends in a plane parallel to its light outlet surface. This aperture layer is light-impermeable with the exception of a solid angle region opened in the direction of the object and in the projection area of the microlenses along their optical axis.

The aperture layer can at the same time be either an opaque electrode layer or insulating layer, both types of aperture layer can be applied at the same time in one light source (front- and rear-side). Structured openings in the aperture layers can allow the light outlet for the illumination of the object (in this case not the electrode since otherwise no light would be produced at this position, the object-side electrode in this case should be transparent) or light can emerge through the imaging channels. This means also that, in addition to the transparent electrode, also the (OLED) light emission layer need not necessarily be structured, but rather can be continuous and have a light-emitting effect only at the positions at which electrodes are present by structuring on both sides thereof (no "structured emitter" but "structured current flow").

Figure 1:
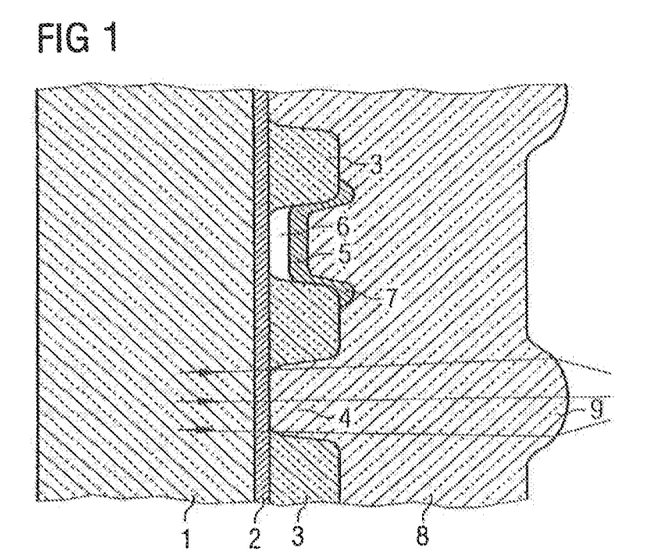
FIG. 1, a section through a microlens array according to the invention.

The construction is illustrated in FIG. 1 by way of example. The reference number 3 shows the aperture structure described here.

If the microlens array has at least two light sources, then such an aperture layer can extend between these. Such an aperture layer is particularly sensible for preventing scattered light from impairing the imaging result and the contrast. The aperture layer preferably has or comprises electrically non-conducting, structurable and/or light-absorbing materials. In particular, a black matrix polymer with a high volume resistance is possible for the aperture layer.

In order to avoid disruption by scattered light, the basic body can in addition be designed to be so thin that the light emitted from the light sources, after total reflection once on the object-side interface of the optically transparent basic body, cannot impinge upon an adjacent microlens.

It is preferred that the at least one light source of the microlens array is contacted by at least one anode and at least one cathode as electrodes. These electrodes can be part of a grid or be disposed individually. It is particularly advantageous if the anode or the cathode is light-impermeable and disposed such that the light source contacted by it is screened in a light-impermeable manner from the anode or the cathode in the direction of the detector elements. Consequently, scattered light is also prevented from impinging upon a possibly present detector and hence impairing the imaging result and the contrast. The object of the shading of undesired scattered light and of the electrical contacting of the light sources can be provided by the same components if the light source is contacted on its one side by a light-permeable electrode made of electrically conductive material and is contacted on the side opposite the latter by a light-impermeable electrode made of electrically conductive material. The light-permeable electrode is then disposed between the optically transparent basic body and the light source and the light-impermeable electrode is disposed on the side of the light source orientated away from the basic body. An electrode disposed on the image side hereby serves therefore as light-impermeable aperture layer in order to prevent light radiation in the direction of the image side. There is hereby understood by the image side of the microlens array that side orientated away from the object to be recorded, whilst there is understood by the object side that side of the microlens array which is situated opposite the latter and orientated towards the object.

There is possible for the transparent electrodes in particular indium-tin oxide (ITO). This can be disposed as a layer on the first side of the microlens array or of the basic body which is orientated away from the microlenses and/or carries the microlenses.

The voltage supply of the individual light sources can be produced simply individually according to the active matrix method or be effected according to a passive matrix method and/or it can be effected, in groups, in blocks and/or in strips.

The optically transparent basic body can have or comprise glass, glass-like material, plastic material, UV-curable polymer and/or UV-curable inorganic-organic hybrid polymer. Such a material is for example ORMOCER®.

By means of the material of the basic body, the optical properties thereof, such as e.g. its absorption, can be controlled.

The microlenses can all or partially be spherical and/or aspherical lenses. There are possible also cylinder lenses, elliptical lenses, semi-spherical lenses, convex and concave lenses and other lens shapes. Also gradient lenses and Fresnel lenses are possible.

Also refractive lenses, lenses which are refractive in parts, diffractive optical elements and/or refractive-diffractive hybrids are possible.

The microlenses can have or comprise glass, glass-like material, plastic material, UV-curable polymer and/or UV-curable inorganic-organic hybrid polymer. They can be formed from the same material as the basic body or from a different material. During production of the basic body or after production thereof they can also be shaped in the latter or moulded on these.

The configuration of the microlens array as plastic material compression moulded or injection moulded part or also as hot-embossed, thin plastic material plate in which the separating walls ("baffles") can be already embedded, is likewise conceivable.

The invention relates in addition to an imaging system for imaging an object in an object surface into an image in an image surface. The object surface is therefore that advantageously flat surface in which an object to be imaged is situated, whilst the image surface is that surface in which the image is produced by the imaging lens system. Object- and/or image plane are preferably parallel to the plane in which the microlens array or the basic body or the lens planes of the microlenses extends. The microlens array is disposed between the image surface and the object surface. A microlens array as was described above is according to the invention.

By means of the imaging system according to the invention, preferably an object which corresponds in its extension to the edge length of the microlens array situated closest to the object can be imaged into an image in an image plane, the lateral edge length of which corresponds to the edge length of that microlens array which is situated closest to the image surface.

A construction with the object field extension is particularly interesting for the applications. A correct object field extension is a condition for an optical system being able to scan completely an extended object field region, which is extended in particular beyond the object field of an individual channel, without e.g. mechanical "scanning".

The imaging system according to the invention can have, in addition to the first microlens array, a further microlens array with a large number of microlenses. In this way, imaging in the conventional sense is possible. This second microlens array is then disposed such that each microlens of the second microlens array is situated on the optical axis of a microlens of the first microlens array. Preferably the corresponding microlenses of the first and of the second microlens array have parallel lens planes. In addition, it is preferred if the optical main axes respectively of the two microlenses coincide. The microlenses are in addition advantageously of the same size so that the projection of the one microlens onto the other microlens along the optical axis precisely overlaps the respectively other microlenses.

The first microlens array depicts here a reversed, real intermediate image of the object. This intermediate image is imaged by a further microlens array into the image plane, an upright, real image being produced. At least one further microlens array with field lens function can be used close to the intermediate image plane.

Preferably, the imaging system images the object with an imaging scale of $m=ri/r0$, ri being the radius of curvature of the image surface and r0 the radius of curvature of the object surface.

In addition, it is preferred if the image is rotated relative to the object, i.e. can be produced standing upright. Furthermore, it is preferred if the object surface has no non-imagable regions or dead zones and/or the image surface has no regions which are not covered by the image. In addition, the images of individual microlenses should preferably not overlap. In particular, each system of microlenses of different microlens arrays, which microlenses are disposed on a common optical axis, can therefore image a specific object region into a specific image region, the object regions and/or the image regions of different microlens systems not intersecting but abutting against each other and being as large as the central spacing of the microlens systems (=channels). This is adjusted by the field aperture size in the intermediate image plane. Alternatively, partial images transmitted by adjacent channels (also via a plurality of adjacent channels) can however also intersect as long as they are superimposed correctly with respect to position and orientation. By means of simultaneous transmission of an object partial region by a plurality of channels into the same image partial region, an increase in light intensity of the imaging lens system is achieved.

The size of the images of the individual microlenses can correspond to the centre spacing of the microlenses in their array arrangement.

Figure 5:
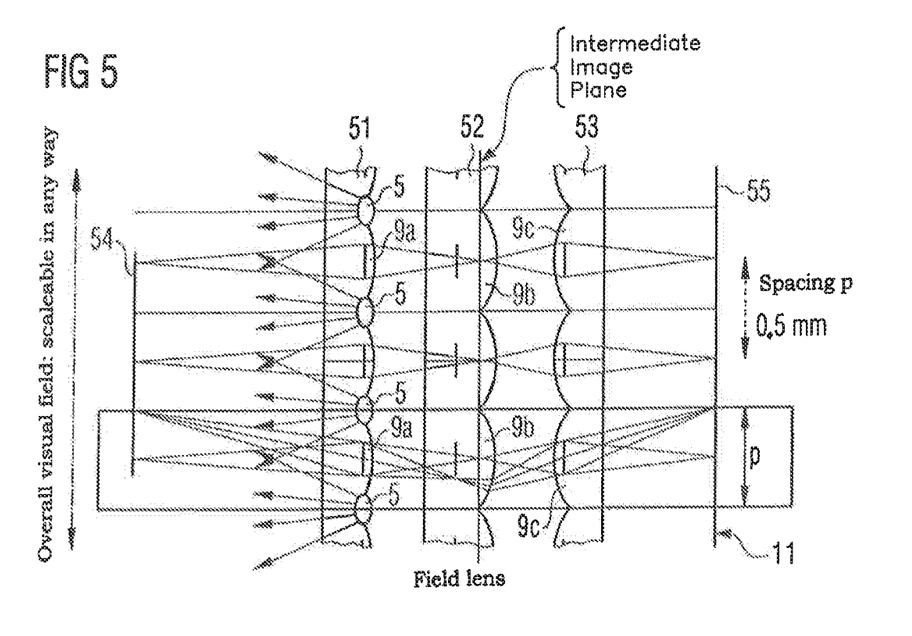
FIG. 5, a section through an imaging system according to the invention.

The arrangement is shown by way of example in FIG. 5. The images of the individual microlenses here have the size p, p describing at the same time the average spacing of the microlenses. The physical extension of the images of the individual microlenses allows in this example recording of a gap-free image with an image converter (or photographic film) without the requirement for further image processing.

It is preferred for many applications if the imaging scale of the imaging system is $m=1$. The imaging system therefore forms objects disposed in the object plane on the scale of 1:1.

With the microlenses of the first microlens array, an intermediate image of an object with an imaging scale of $|m_1|<1$ can thereby be produced respectively in an intermediate plane. This intermediate image is normally reversed relative to the object, i.e. rotated by 180°. With the microlenses of the second microlens array, the intermediate image can now be imaged with an imaging scale $1/m_1$ into the image plane. In total an imaging scale of 1:1 is hence produced.

If object surfaces curved by the imaging system are intended to be imaged sharply, the imaging scale of the imaging system can vary in at least one direction parallel to the surface of the microlens array. The function of this variation hereby depends upon the curvature of the object surface.

According to the invention, a further optical functional surface used in the manner of a field lens can furthermore be provided. It is known that this is not absolutely required for the imaging task but the homogeneity and light intensity of the imaging is improved inter alia. According to the invention, close to the intermediate image plane, a deflection of the light bundles is effected into the free openings of the image-side optical functional surfaces. As a result, a higher image brightness within the individual channels is achieved for the object points which in fact are further away from the respective axis but still transmitted through the field aperture. In general, together with the field aperture position and size, a specific intervention in the vignetting behaviour of the individual channels is therefore possible. As a result, uniformity (homogeneity) of the image brightness is achieved over a plurality of channels of the array. This homogenisation is very desirable for correct reproduction of the object-intrinsic local brightness modulation and is achieved with the present invention.

In addition to a first and a second microlens array, the imaging system in this case has therefore a further third microlens array with a large number of microlenses, which array is disposed between the first and the second microlens array as part of the corresponding lens system such that respectively one microlens of the third microlens array is situated on the optical axis of a microlens of the first microlens array. The optical axes of the microlenses of this third microlens array also coincide here with those of the microlenses of the first microlens array. Respectively one microlens of the first, of the second and of the third microlens array together form therefore one optical channel, light beams which impinge upon a microlens of a microlens array orientated towards the object not leaving the channel assigned to this microlens into another channel. In this way, undesired scattered light can be minimised.

For example, arrays of diffractively acting Fresnel zone plates can be used here particularly advantageously. The advantages of in particular absorptively-transmittively structured zone plates as field lenses reside in their simple producibility (e.g. as simple structuring detail of the absorptive aperture layer required in any case). Hence the production complexity is reduced by avoiding complex process steps. In addition, a merely inessential height profiling emerges as an advantage, which makes it possible for example to bring another substrate in touching contact with the field lens plane. The latter is a method for simplifying the system construction, in particular the adjustment with respect to tilting between the two adjacent elements.

The imaging of the structure of the Fresnel zone plates into the image plane is undesired since it would be superimposed by the imaging of the object plane in an image-impairing manner. This can be prevented in that the plane of the Fresnel zone plates is disposed at a spacing which is sufficiently large but still sufficiently small for the remaining criteria relative to the intermediate image plane. It can consequently be ensured that even the coarsest structures of the diffractive element are still imaged sufficiently out-of-focus into the image plane. It is required as a condition for this that the bundles corresponding to an individual object point should impinge on a penetration surface through the diffractive element which is at least larger than the coarsest structure of the diffractive element.

Imaging channels of this type are then present preferably in an array which is capable of imaging a region of the object plane, corresponding to its perpendicular projection area, in a seam-free manner, without gaps, without artefacts and most extensively without additional image errors (object field extension). An object field extension with a relatively small overlap of the individual image fields is sought as advantageous, however an overlap when high light sensitivity is of particular importance is also conceivable.

It is also preferred here if the individual imaging systems comprising respectively a microlens of the first, of the second and of the third microlens array image separate regions of the object surface, preferably in separate regions of the image surface. Here also there should be no dead zones which are not imaged in the object surface.

The image field of each channel is furthermore suitable for delimitation so that also object points more remote from the axis cannot result in an overlap in an undesired manner. This delimitation is possible for example by complete optical isolation of the individual channels, e.g. by absorbing light-impermeable "vertical walls". This method is also favourable for avoiding other imaging problems (false light, in particular ghost light).

However this objective is significantly less complex to achieve if the imaging scale from object to intermediate image is less than 1 (m__1<1, e.g. m__1=0.36, i.e. reducing) is chosen. In conjunction therewith, a preferably planar field aperture array with a large number of aperture openings is inserted close to the intermediate image plane, which array can be produced/integrated favourably because of its planar configuration.

It is used in order to suppress the superimposition-endangered intermediate images in the light-impermeable regions thereof (preferably by absorption). This protective effect is then exploited to the full if the field aperture openings are chosen in form, size and possibly absorption factor precisely such as is minimally required for a complete, gap-free imaging of the object plane.

The field aperture array is disposed such that respectively one image plane of a microlens of the first microlens array is situated essentially in an aperture opening of the field aperture array, the size of the respective field aperture opening corresponding to the size of the respective intermediate image or in fact defining this. It is preferred that the axial position of the field aperture array relative to the intermediate image plane and/or the form of the aperture openings are designed such that the brightness of an image point is independent of the lateral distance between the image point and the optical axes of the adjacent microlens channels contributing to the image thereof.

The construction is represented by way of example in FIG. 5. In the lower channel in FIG. 5, it is seen how an object point of surface 54 is imaged at the upper edge of this channel into the lower edge of the field aperture plane in the centre of the element 52. This means that the size of the field aperture here corresponds to the size of the respective intermediate image. The homogeneity of the light distribution in the image (of one channel) can hereby be influenced by the axial position of the field aperture relative to that of the intermediate image and also by the form of the field aperture. Both possibilities are used in order to achieve as high as possible homogeneity of the image of one channel and, hence also of the total image. The latter describes that the brightness of an image point is independent of the lateral distance between image point and optical axis of one channel.

The channel structure of the imaging system should not be characterised by an (additional and undesired) modulation (i.e. modulation deviating from the object modulation) of the total image. If this however cannot be avoided, it can be compensated for also by subsequent digital image processing (calibration), just as also the image extension (but not object field extension) can consequently be achieved.

Also close to the object-side and image-side optical functional surfaces, optional aperture layers can be disposed. On the one hand, these serve to cover edge regions of individual lenses and transition regions between adjacent lenses. The beams passing through in these surface regions are detrimental to the imaging properties and therefore are advantageously masked.

Furthermore, by means of a larger number of aperture layers with as large an axial spacing as possible relative to each other and also as small opening proportions as possible (low filling factors), the effective cross-sections for disruptive beam paths (so-called ghost beams which extend diagonally through elements of a plurality of imaging channels) are reduced.

In order to minimise scattered light, there can be disposed between at least two or all microlenses, which are adjacent to each other, of a microlens array, of a lens system and/or, between adjacent light sources, also absorbing and/or light-impermeable walls. The walls can extend in particular over the spacing between two adjacent microlens arrays so that the imaging channels are screened mutually by such light-impermeable walls. Also the basic body can be structured thus with corresponding material choice.

A particularly robust production of the imaging system which is readily adjustable is possible if the first and/or the second and/or the third microlens array and/or a possibly present field aperture array are disposed with their surfaces abutting against each other in a form fit.

The imaging system according to the invention can in addition have additional aperture layers at a large axial spacing from each other and small aperture openings.

The desired imaging function can be achieved with three basic bodies structured on one side. However, also at least one of the microlens arrays can be a combination of at least two microlens arrays. Furthermore an array of scattering lenses can be disposed in or close to the image plane or image surface.

One or more microlens arrays can have a surface coating which improves the optical properties thereof.

According to the invention, a method for producing a microlens array, as was described above is provided in addition. A large number of microlenses, preferably in an array arrangement is disposed or formed hereby on, in, at and/or behind a first side of a flat, optically transparent basic body. In addition, at least one light source is disposed at, in or on the optical transparent basic body such that the projection of the at least one light source is situated in the direction of the optical main axes of the microlenses or in a direction perpendicular to the plane of the microlens array on the first side between the lenses. What was said above applies to the components produced here.

An electrode in contact with at least a part or with all the light sources is preferably produced by vapour deposition of a metallic material. A shadow mask can hereby be used for structuring the electrodes.

The microlenses can be produced by reflow processes, moulding of UV-curing polymer, UV-reaction casting, etching in glass, embossing, printing, in a plastic compression-moulding process, by injection moulding and/or by a moulding technique with negative moulds.

Moulding techniques in which a previously flowable basic substance in contact with a negative mould is cured are particularly advantageous. With these methods, thermal, mechanical and chemical process parameters can be achieved, which (in material and construction) are compatible with the durability limits of suitable OLEDs. Consequently microlenses can be applied on previously produced OLEDs. Additional advantages can be achieved if the cured microlens material in the form of a continuous layer produces encapsulation of the sensitive OLEDs relative to environmental influences, such as e.g. water, oxygen, mechanical pressure etc. The above-described screening of light of the illumination elements which is radiated towards the image can protect these OLED regions from UV light during UV curing steps.

In addition, an image detection device with an imaging system according to the invention, as described above, is according to the invention. At least one optoelectronic image converter or photographic film is hereby disposed in or close to the image surface or image plane. The image converter can be a digital image converter, a CCD chip, a CMOS- and/or an organic image sensor. Preferably, the image detection device is designed such that the size of the detector pixels of a digital image converter or the resolution of a photographic film corresponds precisely to the size of parts of the object which can still be resolved by the system. In addition, the lateral extension of the image sensor can correspond to the lateral extension of the object and/or of the microlens arrangement.

The lens system design according to the invention can be scaled without difficulty. If all linear dimensions, including radii of curvature, aperture sizes etc. (with the exception of the wavelength) are scaled for example towards being smaller, then in fact the respective object field of each individual imaging channel is reduced. The object field which can be imaged can however be obtained when assembled in its lateral extension in that merely a larger number of the now smaller imaging channels are assembled to form the array lens system. This is made possible by the properties of being able to be combined which are produced according to the invention (field extension conditions) which are obtained when scaling.

In the following, the invention is intended to be explained with reference to a few examples. These examples should not be understood to be restrictive and the features shown in them can be combined according to the invention also with each other.

There are shown.

EMBODIMENT 1

Layer Sequence and Construction

FIG. 1 represents in schematic size ratios an example of a possible construction of a microlens array according to the invention.

There is situated on a glass substrate 1 an electrically conductive, transparent layer 2 comprising for example 10 to 500 nm or 100 to 200 nm indium-tin oxide (ITO). An ITO layer for example of 180 nm or 145 nm thickness is used for this embodiment and is commercially available in the form of ITO-coated glass substrates.

The ITO layer 2 (anode) is advantageously structured roughly by means of normal etching processes.

A layer 3 comprising electrically non-conducting, highly absorbing polymer, for example a "black polymer" such as PSK1000 (Brewer Science) is structured photolithographically thereon. This layer contains adjustment marks 702 for the following layers. For reasons of visibility and avoidance of error accumulation, the layers are advantageously all adjusted with respect to this layer 3.

The layer 3 contains functionally transparent, i.e. free, openings for the optically imaging channels 4 and transparent, free openings for the illumination elements 5.

In this embodiment, light-emitting organic materials for organic light diodes (OLEDs) 6 are introduced into the openings for the illumination elements 5. Advantageously, this takes place by means of a vapour-deposition method through a shadow mask adjusted with moderate precision requirements.

Figure 3:
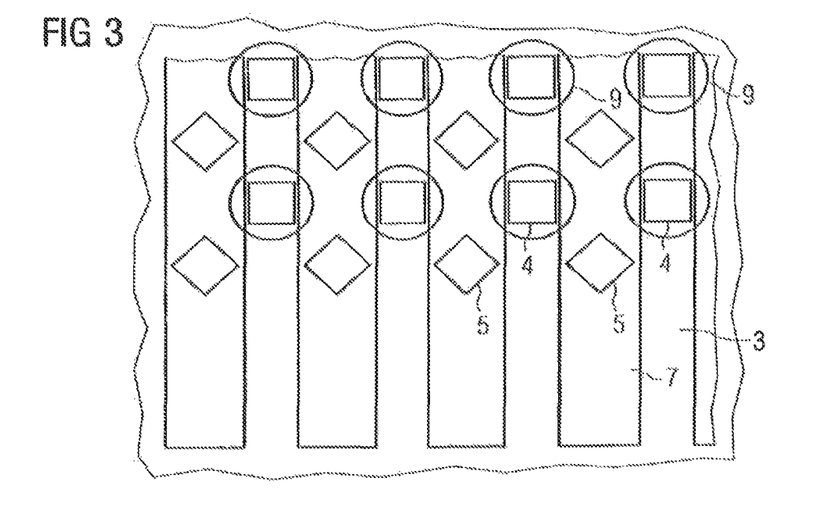
FIG. 3, a schematic representation of the surface allocation in a microlens array according to the invention.

Suitable metal layers 7 are applied as cathodes such that the openings for the illumination elements 5 are completely covered, however the openings for the optical imaging channels 4 are not covered (see FIG. 3). This can be effected in turn for example by vapour-deposition processes with shadow masks, the construction with a non-conducting layer 3 making it possible in particular to use, for the layers 6 and 7, the same shadow mask, possibly even without changing the mask. The shadow masks are thereby designed such that the metal layers 7 form continuous strips up to the edge zones of the total element where they are contacted electrically externally and thus produce the current supply to the OLED cathodes.

Suitable materials for the metal layers 7 are aluminum or metals with lower electron affinity or combinations thereof. As a result of their very low transparency, radiation of the light sources in the direction of the image side is prevented in addition.

Finally, in this embodiment variant, a layer 8 comprising a transparent curing polymer, which is suitable for UV moulding of lens systems, in particular inorganic-organic hybrid polymer, such as for example ORMOCER®, is applied. By means of UV moulding, preferably in a mask aligner, microlenses 9 are produced over the openings for the imaging channels 4.

The layer production of the layer 8 is implemented under boundary conditions which prevent impairment of the existing illumination layers 6, for example OLEDs. This is achieved by applying the UV-mouldable polymer under a nitrogen atmosphere and exclusive use of materials which are chemically compatible with OLEDs.

Figure 2:
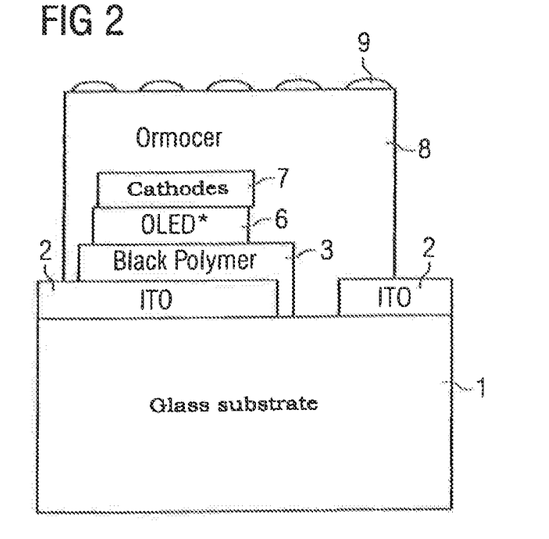
FIG. 2, a schematic representation of the layers in a microlens array according to the invention.

FIG. 2 represents schematically how the layers can advantageously be disposed in their overlaps without illustration of their structuring. A UV-mouldable polymer 8, such as e.g. ORMOCER, can be applied over the OLED 6 and fulfil at least partially the function of a primary encapsulation against damaging environmental influences, such as e.g. water vapour, oxygen, mechanical influences etc.

The represented embodiment is thereafter designed such that only one layer type 2, for example ITO, cuts the limits of the ORMOCER covering towards the side and forms the electrical contacting to the exterior.

FIG. 2 shows a layer series or a technological sequence without thereby dealing with the structure of the layers. Single edge openings of the different layers through others are jointly shown. The structure of the individual layers is described in FIG. 1. The contact between ITO and OLED is also shown there, which contact must be produced of course in order to actuate the OLED electrically, i.e. to enable the current flow.

FIG. 3 represents how, in a microlens array according to the invention, allocation of the substrate basic surface is conveniently produced, by way of example.

In an otherwise light-impermeable layer 3 which is produced here from PSK1000 black matrix polymer (Brewer Science), two types of transparent openings are structured.

The transparent openings for the imaging channels 4 are disposed in a square, 180 μm×180 μm large and with periodic repetition after respectively 500 μm in two mutually perpendicular directions in the substrate plane. The light-emitting zones of the illumination elements 5 which are likewise defined by openings in the electrically non-conducting black matrix layer 3 are situated between these openings for the imaging channels 4. The illumination elements 5 are here for example 180 μm×180 μm large and are disposed in a grid analogously to that of the openings for the imaging channels 4 in the intermediate spaces thereof.

The orientation of the squares of the illumination elements 5 relative to the openings for the imaging channels 4 is rotated by 45° in order to increase the minimum spacing between the two functional surfaces of the imaging channels 4, and the illumination elements 5. The latter, in conjunction with sufficiently thinly chosen substrates 1, serves for disruptive light reduction in an imaging system constructed with microlens arrays. The openings of the imaging channels 4 are impinged upon therefore only by simply reflected beams with as large a minimum angle as possible relative to the surface normal.

There extend between the openings of the imaging channels 4, approx. 300 μm strips of the metallic cathode layer 7, for example aluminum, which serve for the illumination elements 5 as electrodes and for current supply. The layer strips 7 are for example vapour-deposited, the structuring being achieved by means of an adjusted shadow mask comprising 180 μm thick stainless steel. The cathodes are contacted electrically to the exterior via structuring of ITO tracks which are separated from the actual anode regions.

By way of example, the base areas for the moulded microlenses 9, which need not necessarily have the shape of circular discs, are plotted. The minimum size of these base areas for the microlenses 9 is determined according to the penetration cross-section of the desired beam bundles, which are delimited by the aperture layers, in the plane of the lens apex. These sizes are obtainable directly with the help of the indicated "prescription data" and e.g. current lens design software. In the case of three microlens arrays, the base areas of the microlenses 9 of the external microlens arrays are chosen for example with a diameter of 300 μm. The microlens array situated therebetween has microlenses 9 with a diameter of 400 μm (as a result of a larger spacing between lens apex and aperture plane).

Figure 4:
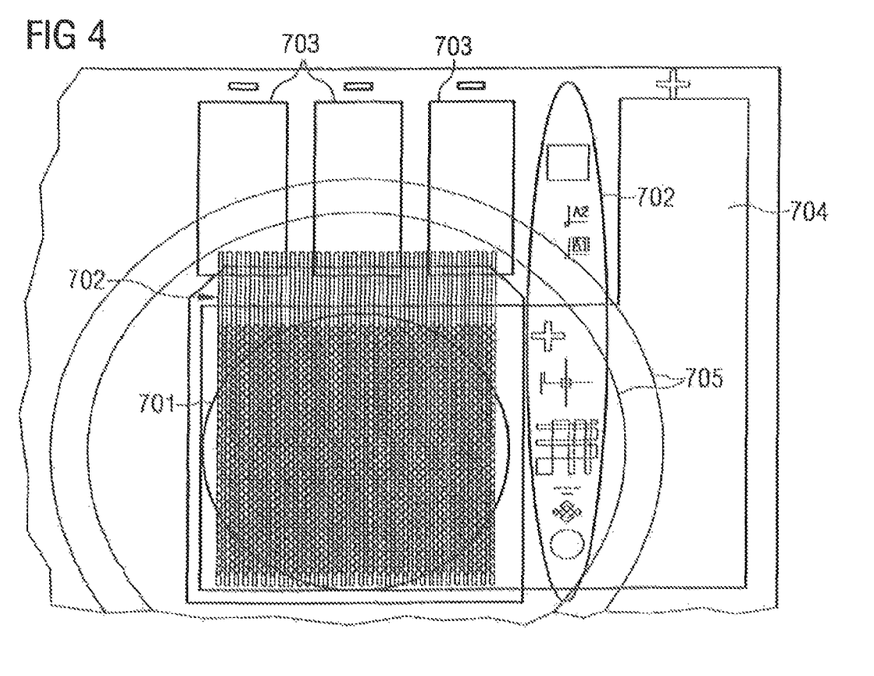
FIG. 4, a view on a microlens array according to the invention.

FIG. 4 shows a plan view on a microlens array according to the invention. The active zone 701 is approx. 16 mm×16 mm large and contains thereupon 31×31 imaging elements 9 (microlenses 9) and also 32×32 illumination elements 5 (OLED pixels 6). A strip-shaped region 702 contains different alignment markings for adjustment, which can be found easily, and structures for process diagnosis. The contacting regions for the external current supply to the OLEDs form the ITO surfaces 703 (three cathode regions) and 704 (common anode region). The subsidiary lines 705 enclose that circular disc which is intended to be covered minimally (inner circle) or maximally (outer circle) by the encapsulating lens material 8, e.g. an ORMOCER®.

FIG. 5 shows schematically a part of a section through a flat 1:1 imaging system according to the invention which uses a microlens array 51 here as front element. The array imaging system is produced by a flat combined arrangement laterally of single-channel imaging systems with an arbitrary extension. Without further lens design and without influence on the object-image spacing, the object field 54 of the array imaging system can be adapted to the object surface 54 to be imaged. As an alternative, the image field of the array imaging system can be adapted in surface and shape to a given image sensor (CCD, CMOS, OPD, an image sensor based on an organic semiconductor material as active layer and the like).

The imaging system, given by way of example, images an object plane 54 with object field extension and image field extension onto the image surface 55. An opto-electronic image converter or a photographic film can be disposed in or close to the image surface 55. The opto-electronic image converter 11 can, for example, be a digital image converter 11, a CCD chip 11, a CMOS sensor 11, or an image sensor based on an organic semiconductor material as an active layer.

It is achieved by three refractive microlens arrays (MLA) 51, 52, 53 on glass substrates. In this embodiment variant, the first MLA 51 on the object side is a microlens array 51 according to the invention which can be produced as indicated in the above embodiment.

Also the second microlens array 52 and the third microlens array 53 are produced conveniently, by production technology, respectively, by single-sided coating of a glass substrate 1. They contain an aperture layer comprising highly absorbing polymer, such as, e.g., PSK2000, which in this case need fulfill no particular electrical requirements. The microlenses 9a, 9b, 9c are produced from a transparent, curing polymer 8, which is suitable for UFV moulding of lens systems, such as, e.g., ORMOCER®. By means of UV moulding, preferably in a mask aligner, microlenses 9a, 9b, 9c, which are adjusted thereto, are produced over the openings for the imaging channels 4.

The indicated lens design is applied such that the aperture layer openings for the imaging channels 4 are identical in all three arrays 51, 52, 53. This enables use of the same photolithographic mask(s) for a plurality of aperture layers in the system and is consequently in particular an economical variant for small series and prototypes. This boundary condition can be omitted in favour of improved imaging properties if the economic advantage of the saving in mask is of no consequence.

Figure 6:
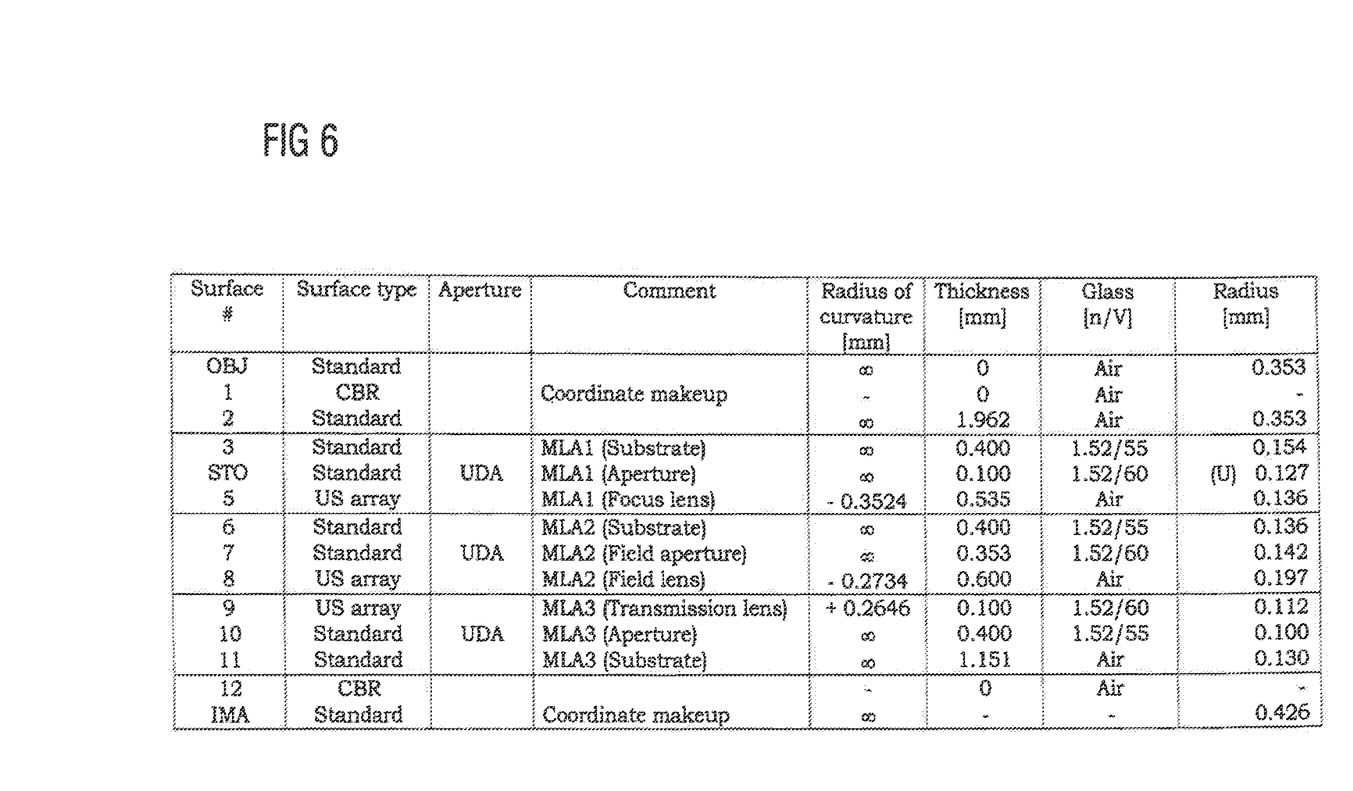
FIG. 6, a table with numerical values, given by way of example, for the design of the microlens array according to the invention.

The table in FIG. 6 describes the optical layer construction of an imaging system with the imaging scale 1:1. Each line corresponds to one layer. Apart from the object (OBJ), the image (IMA) and the aperture stop (STO), all surfaces are described with serial numbers. The columns include important parameters of each surface (from left to right: surface number, surface type, aperture, comment, radius of curvature (RoC for radius of curvature), thickness, type of glass (described by two parameters n and V), lateral radius (semi-diameter)). Surfaces with an infinitely large radius of curvature are plane-parallel.

The optical data of the examples are reproduced in FIG. 6. The array is composed of identical copies of individual channels with the properties described there, the optical axes of which are orientated parallel to each other. The channels are disposed in a Cartesian grid, the length of the periodic repetition of which in both directions is 500 µm. All the individual channels are disposed on a common, flat arrangement surface.

There is situated on the layer surface 3 respectively one square aperture opening in each imaging channel with a transparent region of 180 µm×180 µm.

The surfaces described here are listed in the table in FIG. 6. They are characterised by the title "UDA" for "User Defined Aperture" in the column "Aperture".

A system results with an object-image spacing of 6 mm. For 1:1 imaging of the 15.5 mm×15.5 mm large object field, 31×31 optical imaging channels and also 32×32 illumination elements (OLEDs) are used.

2. EMBODIMENT

According to this statement, now a $2^{nd}$ embodiment is intended to be indicated based on the previous example. In order to avoid unnecessary repetitions, this should be understood as follows:

This embodiment corresponds to the construction according to the $1^{st}$ embodiment. All the linear dimensions which are contained in the optical data of FIG. 6 are intended to be multiplied by the factor 0.1 (scaled) and thereafter produce the optical data of this $2^{nd}$ embodiment. In particular, these are the data of the columns RoC (radius of curvature), "thickness" (axial surface spacings) and also "for the shape" "semi-diameter" (radius of the penetration surface). It should be taken into account that the necessary substrate thicknesses must likewise be scaled. It can be sensible in the individual case and is readily possible according to the invention to adapt the scaling factor such that, after the scaling, currently available purchasing parts, e.g. substrate glasses in standard thicknesses, can be used.

At the same time, the linear dimensions with respect to the plan views on the microlens arrays are intended to be multiplied by the factor 0.1. There results therefrom a pitch (repetition period) of 50 µm, respectively aperture openings of 18 µm×18 µm, OLED pixels of 18 µm×18 µm and cathode strip widths of 30 µm.

According to this scaling, a system results with an object-image spacing of 600 µm. For 1:1 imaging of the 15.5 mm×15.5 mm large object field, 310×310 optical imaging channels and also 311×311 illumination elements (OLEDs) are used.

The invention claimed is:

1. Microlens array with a flat, optically transparent basic body, a plurality of microlenses having optical axes disposed on, at, in or behind a first side of the optically transparent basic body and at least one light source which is disposed at, in or on the flat, optically transparent basic body, the projection of the at least one light source being in the direction of the optical axes of the microlenses onto the first side of the optically transparent basic body between the microlenses.

2. Microlens array according to the claim 1, characterised in that the at least one light source has a flat light source, an organic light diode, an organic luminescent diode, structured EL (electroluminescent) foil or quantum dot LEDs.

3. Microlens array according to claim 1, characterised in that the at least one light source and the microlenses are disposed on the same side of the optically transparent basic body.

4. Microlens array according to claim 1, characterised in that the at least one light source is disposed on that side of the optically transparent basic body opposite the first side.

5. Microlens array according to claim 1, characterised in that the optically transparent basic body extends in one plane.

6. Microlens array according to claim 1, characterised in that said at least one light source includes a plurality of light sources and wherein said plurality of microlenses and plurality of light sources are disposed in a rectangular grid in lines and columns perpendicular to each other or in a hexagonal grid.

7. Microlens array according to claim 6, characterised in that the light sources have light emitters between two electrodes, comprise polymers and/or small molecules.

8. Microlens array according to claim 6, characterised in that said light sources can be produced to be parallel or can be produced on large surfaces on a wafer scale.

9. Microlens array according to claim 1, characterised in that the ratio of axial edge length of the composite of microlens array and optically transparent basic body to the lateral edge length is less than 1:25.

10. Microlens array according to claim 1, characterised in that the microlens array has at least two light sources which have different emission spectra.

11. Microlens array according to claim 1, characterised in that at least one of the at least one light source emits at least a part of the emitted radiation in a spectral range outside of visible light.

12. Microlens array according to claim 1, characterised in that the at least one light source is characteristically flat but has a light-emitting effect only in zones disposed in an array-like manner.

13. Microlens array according to claim 1, characterised in that the at least one light source is effected by electrical actuation according to an active matrix- or passive matrix method.

14. Microlens array according to claim 1, characterised in that the microlens array has at least one light source having a light outlet surface lying in a plane, and said at least one light source is surrounded by an aperture layer in a plane parallel to the plane of its light outlet surface which is light-impermeable.

15. Microlens array according to claim 1, characterised in that the microlens array has at least two light sources lying in a plane and in that at least two of the at least two light sources are surrounded by an aperture layer which extends between them in a plane parallel to the plane of said at least two light sources.

16. Microlens array according to claim 15, characterised in that the aperture layer comprises electrically non-conducting, structurable and/or light-absorbing materials.

17. Microlens array according to claim 15, characterised in that the aperture layer comprises at least one black matrix polymer with a high volume resistance.

18. Microlens array according to claim 1, characterised in that the at least one light source is contacted by at least one anode and at least one cathode as electrodes.

19. Microlens array according to claim 18, characterised in that the at least one anode or the at least one cathode is light-impermeable and is disposed such that the corresponding light source is screened in a light-impermeable manner by the anode or the cathode in a direction along the axes of the microlenses.

20. Microlens array according to claim 19, characterised in that a light-permeable electrode made of electrically conductive material is disposed between the optically transparent basic body and the at least one light source or a light-impermeable electrode made of electrically conductive material is disposed on the opposite side of the light source.

21. Microlens array according to claim 20, characterised in that the anode or cathode of at least one light source serves, on the image side, at the same time as light-impermeable aperture layer in order to prevent light radiation in the direction of the image side.

22. Microlens array according to claim 21, characterised by at least one light-impermeable electrode or at least one light-absorbing aperture layer which is disposed such that both the light radiation of the at least one light source and the reflection of the light emitted from the at least one light source of all elements apart from an object to be imaged is prevented in the direction of the image side.

23. Microlens array according to claim 1, characterised by a conductive, transparent layer which is orientated away from the microlenses and/or the side of the microlens array which has the microlenses.

24. Microlens array according to claim 23, characterised in that the conductive, transparent layer comprises indium-tin oxide (ITO), ZnO or thin metal layers.

25. Microlens array according to claim 1, characterised in that the optically transparent basic body comprises glass, glass-like material, plastic material, UV-curable polymer and/or UV-curable inorganic-organic hybrid polymer.

26. Microlens array according to claim 1, characterised in that the microlenses are formed in the optically transparent basic body.

27. Microlens array according to claim 1, characterised in that at least a part of each of the microlenses is spherical lens.

28. Microlens array according to claim 1, characterised in that the microlenses comprise glass, glass-like material, plastic material, UV-curable polymer or UV-curable inorganic-organic hybrid polymer.

29. Microlens array according to claim 1, characterised in that at least a part or all of the microlenses are refractive lenses, lenses which are refractive in parts, Fresnel lenses, diffractive optical elements or refractive-diffractive hybrids.

30. Microlens array according to claim 1, characterised in that the optically transparent basic body is configured to be thin such that the light emitted from the at least one light source, with total reflection once on the object-side interface of the optically transparent basic body, cannot impinge upon an adjacent microlens.

31. Microlens array according to claim 1, characterised in that the optically transparent basic body comprises a material which allows structuring of its optical absorption properties.

32. Imaging system for imaging at least one object in an object surface into at least one image in an image surface with at least two optical functional surfaces, characterised in that at least one of the at least two optical functional surfaces as first microlens array is a microlens array according to claim 1.

33. Imaging system according to claim 32, characterised in that the imaging system is configured such that an object which extends over a lateral edge length of the microlens array situated closest to the object surface is imaged into an image surface which extends over a lateral edge length of the microlens array situated closest to the image surface.

34. Imaging system according to claim 32, characterised by a second microlens array with a plurality of microlenses, the second microlens array being disposed such that each microlens of the second microlens array is centred on the optical axis of a respectively assigned microlens of the first microlens array and is orientated congruently to the latter.

35. Imaging system according to claim 34, characterised by a third microlens array with a plurality of microlenses, which is disposed between the first and the second microlens array such that respectively one microlens of the third microlens array is centred on the optical axis of one microlens of the first microlens array.

36. Imaging system according to claim 35, characterised in that each microlens of the first microlens array or each imaging system comprising a microlens of the first microlens array and of the second microlens array and/or of the third microlens array has an object field and in that the object fields of mutually adjacent microlenses or microlens imaging systems do not overlap or do so only slightly, and/or no non-imaged regions or dead zones exist in the object field.

37. Imaging system according to claim 35, characterised in that structures of the third microlens array are imaged out-of-focus in the image plane.

38. Imaging system according to claim 35, characterised in that the first microlens array and/or the second microlens array and/or the third microlens array are disposed with their surfaces abutting in a form fit.

39. Imaging system according to claim 35, characterised in that at least one of said microlens arrays is a combination of at least two microlens arrays.

40. Imaging system according to claim 32, characterised in that the image can be produced without rotation relative to the object.

41. Imaging system according to claim 32, characterised in that the object surface has no non-imaged regions or dead zones and/or the image surface has no regions uncovered by images of the individual microlenses and/or the image surface has essentially no overlaps of the images of individual microlenses.

42. Imaging system according to claim 32, characterised in that the object can be imaged with the imaging system on the imaging scale m=1.

43. Imaging system according to claim 32, characterised in that the imaging scale of the imaging system varies in at least one direction parallel to the surface of the microlens array such that curved object surfaces can be imaged sharply.

44. Imaging system according to claim 32, characterised in that, with the lenses of the first microlens array, respectively an intermediate image of an object which is reversed relative to the object can be produced in an intermediate image plane with a first imaging scale $|m_1| \leq 1$.

45. Imaging system according to claim 32, characterised in that an array of scattering lenses is disposed in or close to the image surface plane.

46. Imaging system according to claim 32, characterised by one or more aperture layers with small openings compared with their average spacing in order to suppress disruptive light.

47. Imaging method for imaging at least one object in an object surface into an image in an image surface, characterised in that the imaging is effected by an imaging system according to claim 32.

48. Image detection device with an imaging system according to claim 32 and at least one optoelectronic image converter or photographic film disposed in or close to the image plane.

49. Image detection device according to claim 48, characterized in that the image converter is a digital image converter or CCD chip or a CMOS- or an image sensor based on an organic semiconductor material as active layer.

50. Image detection device according to claim 49, characterized in that the image converter or CCD chip or CMOS-, or organic image sensor includes detector pixels and the size of the detector pixels of the image converter, of the digital image converter or of the CCD chip or of the CMOS- or organic image sensor corresponds to the size of the smallest object features which can still be resolved by the system, and in that the lateral extension of the image sensor corresponds to the lateral extension of the object and to the microlens array arrangement.

51. Imaging system characterised by a microlens array disposed on the object surface according to claim 33.

52. Method for producing a microlens array according to claim 1, a large number of microlenses being disposed or moulded in an array arrangement on, at, in or behind a first side of a flat, optically transparent basic body and at least one light source being disposed at, in or on the optically transparent basic body such that the projection of the at least one light source is in the direction of the optical axes of the microlenses onto a first side between the microlenses.

53. Method according to claim 52, characterised in that at least one electrode is produced in contact with at least a part of the at least one light source by vapour-deposition of at least one metallic material.

54. Method according to claim 53, characterised in that a shadow mask is used during vapour-deposition.

55. Method according to claim 52, characterised in that the microlenses are produced by reflow processes, moulding of UV-curing polymer, UV-reaction casting, etching in glass, embossing, printing, in a plastic compression-moulding process, by injection moulding or by a moulding technique with negative moulds.

* * * * *